United States Patent
Liao et al.

(10) Patent No.: US 10,095,285 B2
(45) Date of Patent: Oct. 9, 2018

(54) PORTABLE ELECTRONIC DEVICE AND DETACHABLE AUXILIARY HEAT-DISSIPATING MODULE THEREOF

(71) Applicant: COOLER MASTER CO., LTD., New Taipei (TW)

(72) Inventors: Pen-Hung Liao, New Taipei (TW); Shih-Wei Huang, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/406,257

(22) Filed: Jan. 13, 2017

(65) Prior Publication Data

US 2017/0131752 A1    May 11, 2017

Related U.S. Application Data

(62) Division of application No. 14/709,668, filed on May 12, 2015, now Pat. No. 9,600,044.

(51) Int. Cl.
*G06F 1/20* (2006.01)
*H05K 7/20* (2006.01)
(Continued)

(52) U.S. Cl.
CPC ......... *G06F 1/203* (2013.01); *F28D 15/0233* (2013.01); *F28D 15/0275* (2013.01); *G06F 1/1635* (2013.01); *G06F 1/1656* (2013.01); *G06F 1/187* (2013.01); *H01L 23/427* (2013.01); *H01L 23/467* (2013.01);
(Continued)

(58) Field of Classification Search
CPC ..... G06F 1/1632; G06F 16/203; H01L 23/427
See application file for complete search history.

(56) References Cited

U.S. PATENT DOCUMENTS

| | | | | |
|---|---|---|---|---|
| 6,034,871 A | * | 3/2000 | Cheng | G06F 1/203 165/104.34 |
| 6,058,009 A | * | 5/2000 | Hood, III | G06F 1/203 361/679.47 |

(Continued)

*Primary Examiner* — Robert J Hoffberg
(74) *Attorney, Agent, or Firm* — Muncy, Geissler, Olds & Lowe, P.C.

(57) ABSTRACT

A portable electronic device using a fixed main heat-dissipating module and a detachable auxiliary heat-dissipating module for contacting the fixed main heat-dissipating module. The detachable auxiliary heat-dissipating module includes an outer casing structure and an inside mounted heat-dissipating structure. The outer casing structure includes a detachable casing detachably disposed inside a predetermined receiving groove of the portable electronic device and an electrical connector electrically connected to the portable electronic device. The inside mounted heat-dissipating structure is disposed inside the detachable casing. The inside mounted heat-dissipating structure includes an inside mounted heat-dissipating fan, a plurality of inside mounted heat-dissipating fins, a pump, and a circulation pipe. The circulation pipe has a contact portion exposed from the detachable casing to directly contact the fixed main heat-dissipating module, such that heat generated by the fixed main heat-dissipating module is partially transmitted to the circulation pipe through the contact portion.

4 Claims, 6 Drawing Sheets

(51) Int. Cl.
*F28D 15/02* (2006.01)
*H01L 23/467* (2006.01)
*H01L 23/473* (2006.01)
*H01L 23/427* (2006.01)
*G06F 1/16* (2006.01)
*G06F 1/18* (2006.01)

(52) U.S. Cl.
CPC ....... *H01L 23/473* (2013.01); *H05K 7/20409* (2013.01); *H05K 7/20509* (2013.01)

(56) References Cited

U.S. PATENT DOCUMENTS

| | | | | |
|---|---|---|---|---|
| 6,188,573 B1 * | 2/2001 | Urita | ............... | G06F 1/1616 165/80.3 |
| 6,276,448 B1 * | 8/2001 | Maruno | ............... | G06F 1/1632 165/104.33 |
| 6,459,575 B1 * | 10/2002 | Esterberg | ............... | G06F 1/203 165/185 |
| 6,560,104 B2 * | 5/2003 | DeHoff | ............... | G06F 1/1632 165/104.33 |
| 6,657,859 B1 * | 12/2003 | Karr | ............... | G06F 1/203 165/104.21 |
| 6,674,643 B2 * | 1/2004 | Centola | ............... | H05K 7/20672 165/104.33 |
| 7,532,470 B2 * | 5/2009 | Ariga | ............... | G06F 1/203 361/694 |
| 7,558,059 B2 * | 7/2009 | Kamikakoi | ............... | G06F 1/1616 361/679.4 |
| 7,911,781 B2 * | 3/2011 | Chao | ............... | G06F 1/203 361/679.47 |
| 7,948,750 B2 * | 5/2011 | Hung | ............... | G06F 1/183 165/185 |
| 8,693,196 B2 * | 4/2014 | Wu | ............... | G06F 1/182 361/679.47 |
| 9,204,571 B2 * | 12/2015 | Ou | ............... | H05K 7/20 |
| 9,600,044 B2 * | 3/2017 | Liao | ............... | G06F 1/203 |
| 2001/0033475 A1 * | 10/2001 | Lillios | ............... | G06F 1/1632 361/679.54 |
| 2002/0122298 A1 * | 9/2002 | Cohen | ............... | G06F 1/20 361/679.54 |
| 2005/0254206 A1 * | 11/2005 | Kamikakoi | ............... | G06F 1/1616 361/679.46 |
| 2007/0025077 A1 * | 2/2007 | Kamikakoi | ............... | G06F 1/1616 361/679.54 |
| 2008/0310098 A1 * | 12/2008 | Kamikakoi | ............... | G06F 1/1616 361/748 |
| 2010/0033929 A1 * | 2/2010 | Chen | ............... | G06F 1/203 361/695 |
| 2014/0133102 A1 * | 5/2014 | Lu | ............... | G06F 1/203 361/700 |

* cited by examiner

PORTABLE ELECTRONIC DEVICE AND DETACHABLE AUXILIARY HEAT-DISSIPATING MODULE THEREOF

CROSS REFERENCE TO RELATED APPLICATIONS

This application is a divisional application of Ser. No. 14/709,668 filed on May 12, 2015, and entitled "PORTABLE ELECTRONIC DEVICE AND DETACHABLE AUXILIARY HEAT-DISSIPATING MODULE THEREOF", the entire disclosures of which are incorporated herein by reference.

BACKGROUND OF THE INVENTION

1. Field of the Invention

The instant disclosure relates to a portable electronic device and a detachable auxiliary heat-dissipating module thereof, and more particularly to a portable electronic device and a detachable auxiliary heat-dissipating module thereof for increasing heat-dissipating efficiency.

2. Description of Related Art

A traditional heat sink is a metal device with multiple fins and at least one heat pipe. The fins are stacked and each fin has a surface area, multiple through holes and multiple protrusions. The through holes are defined by the fins and correspond to and align with the through holes of adjacent fins. The protrusions are formed around the through holes and have inner surfaces. The at least one heat pipe abuts an electronic device and is mounted through corresponding through holes and has a pipe wall. Solder is filled between the pipe wall of the at least one heat pipe and the internal surfaces of the protrusions to weld the heat pipe and the protrusions. The heat pipe absorbs heat from the electronic device and transmits the heat to the fins that radiate the heat to the air rapidly due to the surface area of the fins.

SUMMARY OF THE INVENTION

One aspect of the instant disclosure relates to a portable electronic device and a detachable auxiliary heat-dissipating module thereof for increasing heat-dissipating efficiency.

One of the embodiments of the instant disclosure provides a detachable auxiliary heat-dissipating module contacting a fixed main heat-dissipating module, comprising: an outer casing structure and an inside mounted heat-dissipating structure. The outer casing structure includes a detachable casing detachably disposed inside a predetermined receiving groove of a portable electronic device and an electrical connector disposed on the detachable casing and electrically connected to the portable electronic device. The inside mounted heat-dissipating structure is disposed inside the detachable casing, wherein the inside mounted heat-dissipating structure includes an inside mounted heat-dissipating fan electrically connected to the electrical connector, a plurality of inside mounted heat-dissipating fins adjacent to the inside mounted heat-dissipating fan, a pump electrically connected to the electrical connector, and a circulation pipe communicated with the pump and passing through the inside mounted heat-dissipating fins. More particularly, the circulation pipe has a contact portion exposed from the detachable casing to directly contact the fixed main heat-dissipating module, such that heat generated by the fixed main heat-dissipating module is partially transmitted to the circulation pipe through the contact portion.

Another one of the embodiments of the instant disclosure provides a detachable auxiliary heat-dissipating module contacting a fixed main heat-dissipating module, comprising: an outer casing structure and an inside mounted heat-dissipating structure. The outer casing structure includes a detachable casing detachably disposed inside a predetermined receiving groove of a portable electronic device and an electrical connector disposed on the detachable casing and electrically connected to the portable electronic device. The inside mounted heat-dissipating structure is disposed inside the detachable casing, wherein the inside mounted heat-dissipating structure includes an inside mounted heat-dissipating fan electrically connected to the electrical connector, a plurality of inside mounted heat-dissipating fins adjacent to the inside mounted heat-dissipating fan, and an auxiliary heat pipe passing through the inside mounted heat-dissipating fins. More particularly, the auxiliary heat pipe has a contact portion exposed from the detachable casing to directly contact the fixed main heat-dissipating module, such that heat generated by the fixed main heat-dissipating module is partially transmitted to the auxiliary heat pipe through the contact portion.

Yet another one of the embodiments of the instant disclosure provides a portable electronic device using a fixed main heat-dissipating module and a detachable auxiliary heat-dissipating module for contacting the fixed main heat-dissipating module, wherein the detachable auxiliary heat-dissipating module comprises: an outer casing structure and an inside mounted heat-dissipating structure. The outer casing structure includes a detachable casing detachably disposed inside a predetermined receiving groove of the portable electronic device and an electrical connector disposed on the detachable casing and electrically connected to the portable electronic device. The inside mounted heat-dissipating structure is disposed inside the detachable casing, wherein the inside mounted heat-dissipating structure includes an inside mounted heat-dissipating fan electrically connected to the electrical connector, a plurality of inside mounted heat-dissipating fins adjacent to the inside mounted heat-dissipating fan, a pump electrically connected to the electrical connector, and a circulation pipe communicated with the pump and passing through the inside mounted heat-dissipating fins. More particularly, the circulation pipe has a contact portion exposed from the detachable casing to directly contact the fixed main heat-dissipating module, such that heat generated by the fixed main heat-dissipating module is partially transmitted to the circulation pipe through the contact portion.

Therefore, the heat-dissipating efficiency of the portable electronic device or the detachable auxiliary heat-dissipating module thereof is increased due to the design of "the heat generated by the fixed main heat-dissipating module is partially transmitted to the circulation pipe through the contact portion that is exposed from the detachable casing to directly contact the fixed main heat-dissipating module" or "the heat generated by the fixed main heat-dissipating module is partially transmitted to the auxiliary heat pipe through the contact portion that is exposed from the detachable casing to directly contact the fixed main heat-dissipating module".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated.

However, the appended drawings are provided solely for reference and illustration, without any intention to limit the instant disclosure.

DETAILED DESCRIPTION OF THE PREFERRED EMBODIMENTS

The embodiments of "a portable electronic device and a detachable auxiliary heat-dissipating module thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
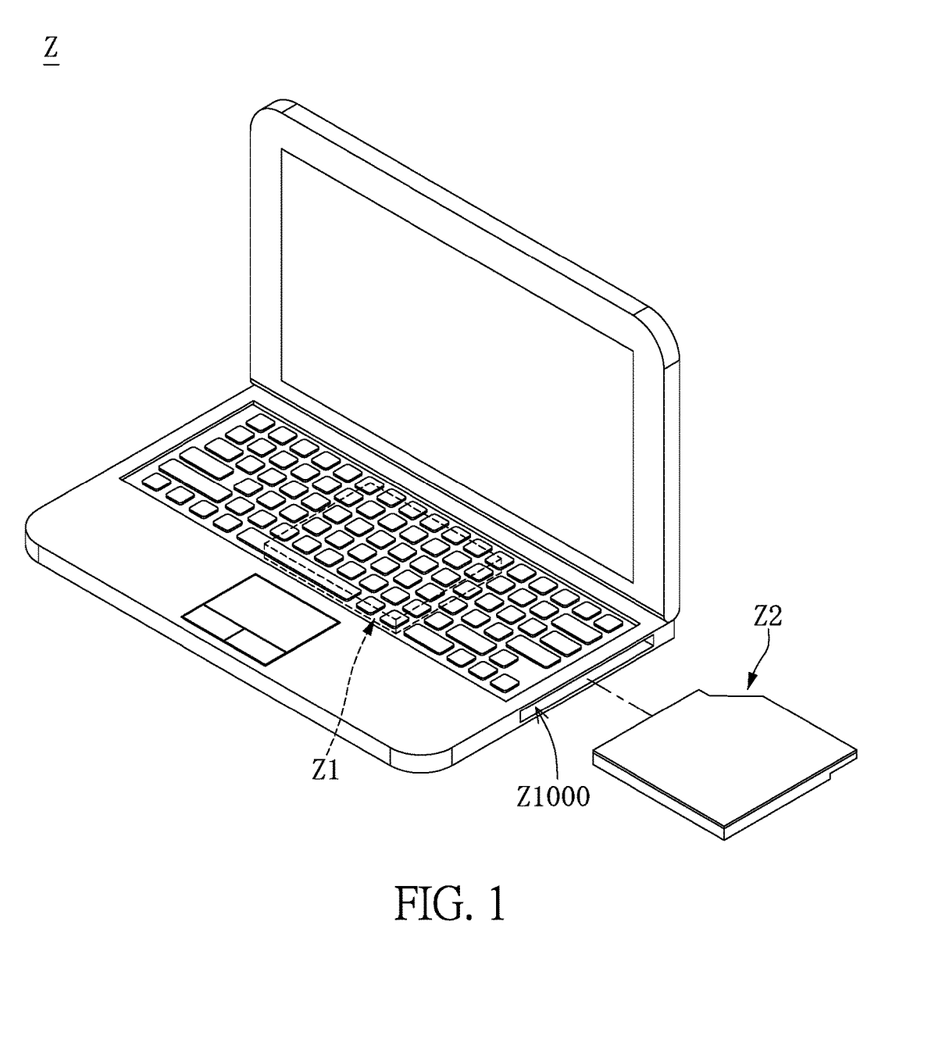
FIG. 1 shows a perspective, schematic view of the detachable auxiliary heat-dissipating module applied to a portable electronic device having a containing groove for receiving a detachable optical disk drive according to the first embodiment of the instant disclosure.
Figure 2:
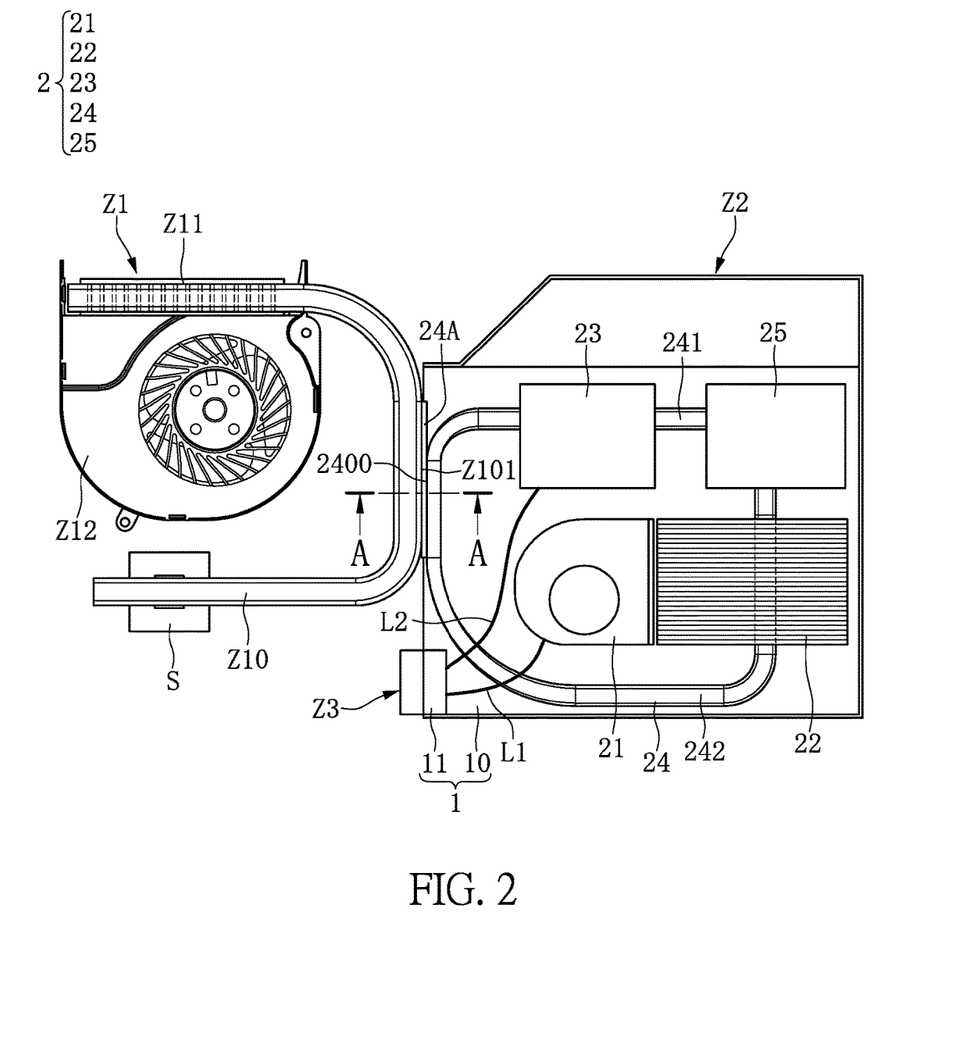
FIG. 2 shows a top, schematic view of the fixed main heat-dissipating module and the detachable auxiliary heat-dissipating module of the detachable auxiliary heat-dissipating module without a top cover according to the first embodiment of the instant disclosure.
Figure 3:
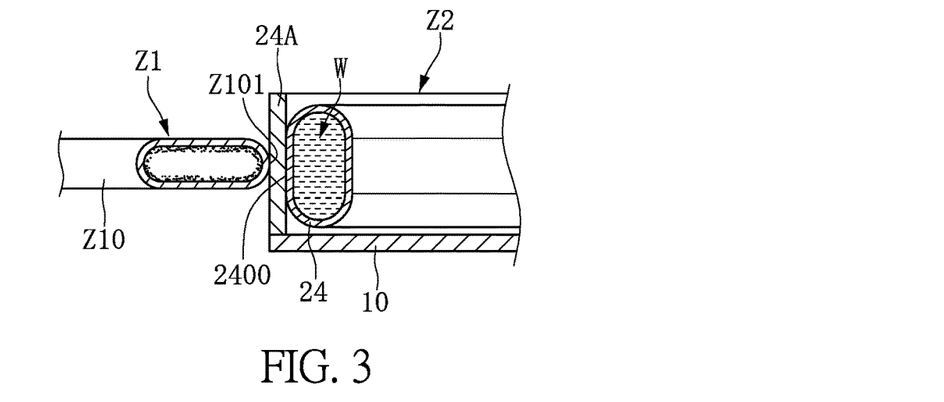
FIG. 3 shows a cross-sectional view taken along the section line A-A of FIG. 2.

Referring to FIG. 1 to FIG. 3, in which FIG. 3 shows a cross-sectional view taken along the section line A-A of FIG. 2. The first embodiment of the instant disclosure provides a portable electronic device Z using a fixed main heat-dissipating module Z1 fixed inside the portable electronic device Z and a detachable auxiliary heat-dissipating module Z2 for contacting the fixed main heat-dissipating module Z1.

Referring to FIG. 1 and FIG. 2, the detachable auxiliary heat-dissipating module Z2 comprises an outer casing structure 1 and an inside mounted heat-dissipating structure 2. The outer casing structure 1 includes a detachable casing 10 detachably disposed inside a predetermined receiving groove Z1000 of a portable electronic device Z and an electrical connector 11 disposed on the detachable casing 10 and electrically connected to a power connector Z3 of the portable electronic device Z. For example, as shown in FIG. 1, the predetermined receiving groove Z1000 of the portable electronic device Z may be a containing groove for receiving a detachable optical disk drive, but that is merely an example and is not meant to limit the instant disclosure. More particularly, when a detachable optical disk drive (not shown) is removed from the predetermined receiving groove Z1000 of the portable electronic device Z, the predetermined receiving groove Z1000 is unoccupied, such that the detachable auxiliary heat-dissipating module Z2 can be inserted into the predetermined receiving groove Z1000, and the electrical connector 11 and the power connector Z3 are electrically connected with each other (as shown in FIG. 2). In addition, a working fluid W is received inside the water reservoir 25 and the circulation pipe 24.

Furthermore, referring to FIG. 1 and FIG. 2, the inside mounted heat-dissipating structure 2 is disposed inside the detachable casing 10, and the inside mounted heat-dissipating structure 2 includes an inside mounted heat-dissipating fan 21 (such as a radial-flow-type fan) electrically connected to the electrical connector 11 through a conductive wire L1, a plurality of inside mounted heat-dissipating fins 22 adjacent to the inside mounted heat-dissipating fan 21, a pump 23 electrically connected to the electrical connector 11 through another conductive wire L2, and a circulation pipe 24 communicated with the pump 23 and passing through the inside mounted heat-dissipating fins 22. More particularly, the inside mounted heat-dissipating structure 2 includes a water reservoir 25 communicated with the circulation pipe 24, and the circulation pipe 24 has a first pipe portion 241 communicated between the pump 23 and the water reservoir 25 and a second pipe portion 242 communicated between the pump 23 and the water reservoir 25 and passing through the inside mounted heat-dissipating fins 22.

Moreover, as shown in FIG. 2, the circulation pipe 24 has a contact portion exposed from the detachable casing 10 to directly contact the fixed main heat-dissipating module Z1, such that heat generated by the fixed main heat-dissipating module Z1 is partially transmitted to the circulation pipe 24 through the contact portion, for water-cooling heat dissipation.

For example, referring to FIG. 2 and FIG. 3, the contact portion may be a heat-conducting pad 24A (such as a sheet heat-conducting pad) disposed on a lateral contact surface 2400 of the circulation pipe 24, and the heat-conducting pad 24A of the circulation pipe 24 is exposed from the detachable casing 10 to directly contact a lateral contact surface Z101 of a main heat pipe Z10 of the fixed main heat-dissipating module Z1, such that the heat generated by the main heat pipe Z10 of the fixed main heat-dissipating module Z1 is partially transmitted to the circulation pipe 24 through the heat-conducting pad 24A, so as to execute water-cooling heat dissipation. In other words, when the main heat pipe Z10 of the fixed main heat-dissipating module Z1 contacts a heat-generating source S, heat generated by the heat-generating source S is transmitted to a plurality of main heat-dissipating fins Z11 through the main heat pipe Z10 of the fixed main heat-dissipating module Z1, and then the heat that is transmitted to the main heat-dissipating fins Z11 is dissipated by matching a main heat-dissipating fan Z12. In addition, the heat generated by the heat-generating source S is partially transmitted to the circulation pipe 24 through the main heat pipe Z10 and the heat-conducting pad 24A in sequence. Please note, the lateral contact surface 2400 of the circulation pipe 24 may be a plane surface, and the lateral contact surface Z101 of the main heat pipe Z10 may be a plane surface, for increasing the heat conduction efficiency. The contacting area between the lateral contact surface 2400 of the circulation pipe 24 and the heat-conducting pad 24A is larger than that between the lateral contact surface Z101 of the main heat pipe Z10 and the heat-conducting pad 24A.

Figure 4:
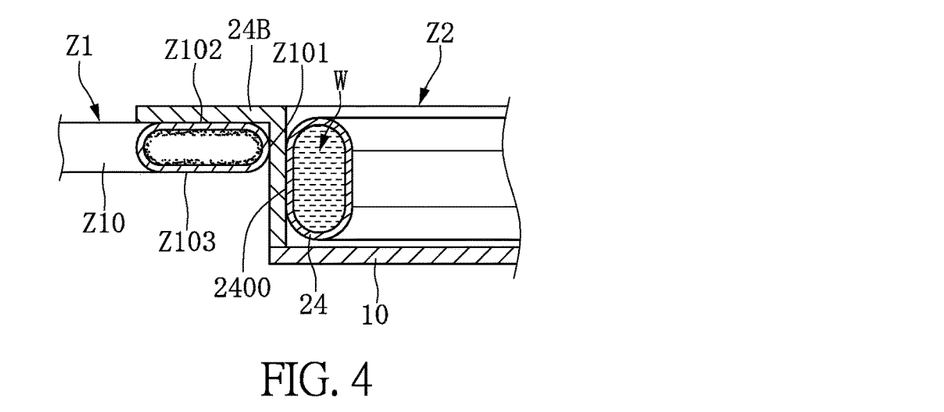
FIG. 4 shows a cross-sectional, schematic view of the detachable auxiliary heat-dissipating module using another heat-conducting pad according to the first embodiment of the instant disclosure.

For another example, referring to FIG. 4, the contact portion is a heat-conducting pad 24B (such as a L-shaped heat-conducting pad) disposed on a lateral contact surface 2400 of the circulation pipe 24, and the heat-conducting pad 24B of the circulation pipe 24 is exposed from the detachable casing 10 to directly contact a lateral contact surface Z101 and a top contact surface Z102 (or a bottom contact surface Z103) of a main heat pipe Z10 of the fixed main heat-dissipating module Z1, such that the heat generated by the main heat pipe Z10 of the fixed main heat-dissipating module Z1 is partially transmitted to the circulation pipe 24 through the heat-conducting pad 24B, for water-cooling heat dissipation. In other words, when the main heat pipe Z10 of the fixed main heat-dissipating module Z1 contacts a heat-generating source S, heat generated by the heat-generating source S is transmitted to a plurality of main heat-dissipating fins Z11 through the main heat pipe Z10 of the fixed main heat-dissipating module Z1, and then the heat that is transmitted to the main heat-dissipating fins Z11 is dissipated by matching a main heat-dissipating fan Z12. In addition, the heat generated by the heat-generating source S is partially transmitted to the circulation pipe 24 through the main heat pipe Z10 and the heat-conducting pad 24B in sequence. Please note, the lateral contact surface 2400 of the circulation pipe 24 may be a plane surface, and the lateral contact surface Z101, the top contact surface Z102, and the bottom contact surface Z103 of the main heat pipe Z10 may be plane surfaces, for increasing the heat conduction efficiency. The contacting area between the lateral contact surface 2400 of the circulation pipe 24 and the heat-conducting pad 24B is larger than that among the lateral contact surface Z101 and the top contact surface Z102 of the main heat pipe Z10 and the heat-conducting pad 24B.

Figure 5:
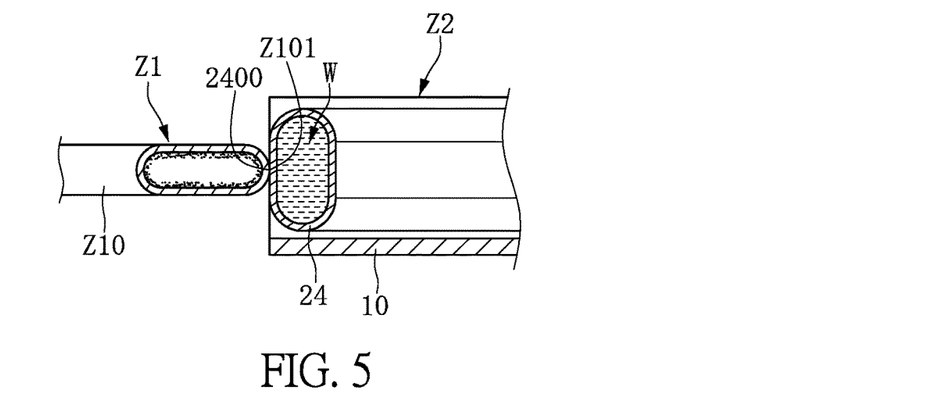
FIG. 5 shows a cross-sectional, schematic view of the detachable auxiliary heat-dissipating module directly contacting the fixed main heat-dissipating module without using any heat-conducting pad according to the first embodiment of the instant disclosure.

For yet another example, referring to FIG. 5, the contact portion may be a lateral contact surface 2400 of the circulation pipe 24 without using the heat-conducting pad (24A or 24B), and the lateral contact surface 2400 of the circulation pipe 24 is exposed from the detachable casing 10 to directly contact a lateral contact surface Z101 of a main heat pipe Z10 of the fixed main heat-dissipating module Z1, such that the heat generated by the main heat pipe Z10 of the fixed main heat-dissipating module Z1 is partially transmitted to the circulation pipe 24 through the lateral contact surface 2400 of the circulation pipe 24, for water-cooling heat dissipation.

In other words, when the main heat pipe Z10 of the fixed main heat-dissipating module Z1 contacts a heat-generating source S, heat generated by the heat-generating source S is transmitted to a plurality of main heat-dissipating fins Z11 through the main heat pipe Z10 of the fixed main heat-dissipating module Z1, and then the heat that is transmitted to the main heat-dissipating fins Z11 is dissipated by matching a main heat-dissipating fan Z12. In addition, the heat generated by the heat-generating source S is partially transmitted to the circulation pipe 24 through the main heat pipe Z10 and the lateral contact surface 2400 of the circulation pipe 24 in sequence.

Figure 6:
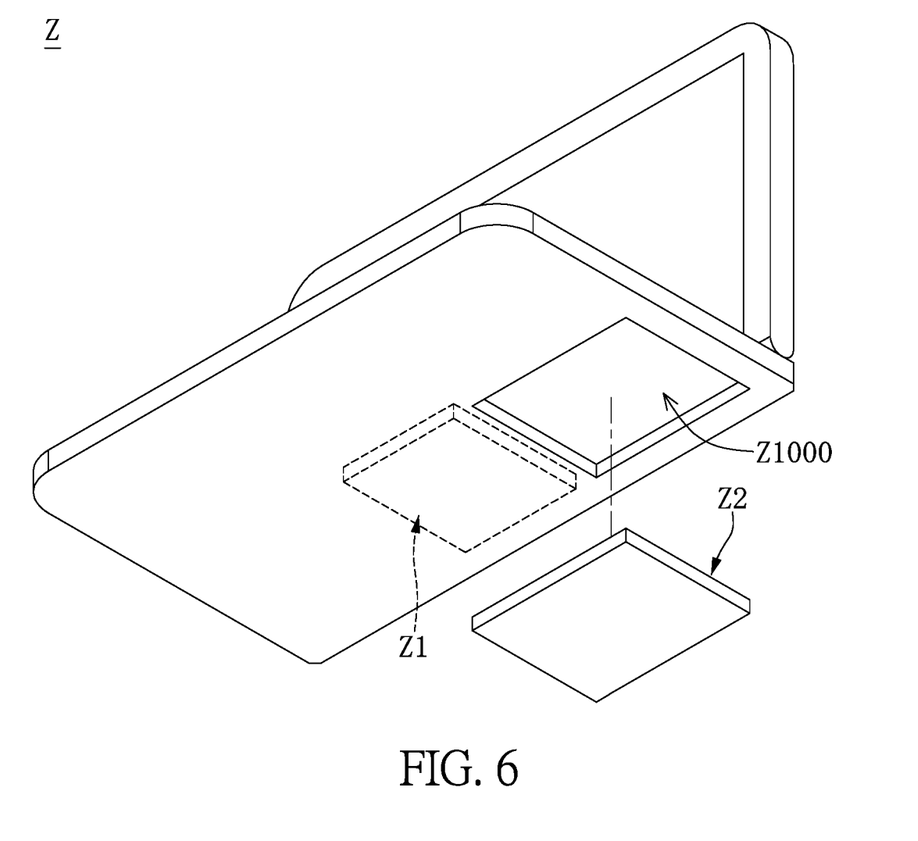
FIG. 6 shows a perspective, schematic view of the detachable auxiliary heat-dissipating module applied to a portable electronic device having a containing groove for receiving a detachable battery according to the first embodiment of the instant disclosure.

It is worth noting that, referring to FIG. 6, the predetermined receiving groove Z1000 of the portable electronic device Z may be a containing groove for receiving a detachable battery, but that is merely an example and is not meant to limit the instant disclosure. In other words, the predetermined receiving groove Z1000 of the portable electronic device Z may be a containing groove for receiving a detachable optical disk drive or a detachable battery according to different requirements.

Second Embodiment

Figure 7:
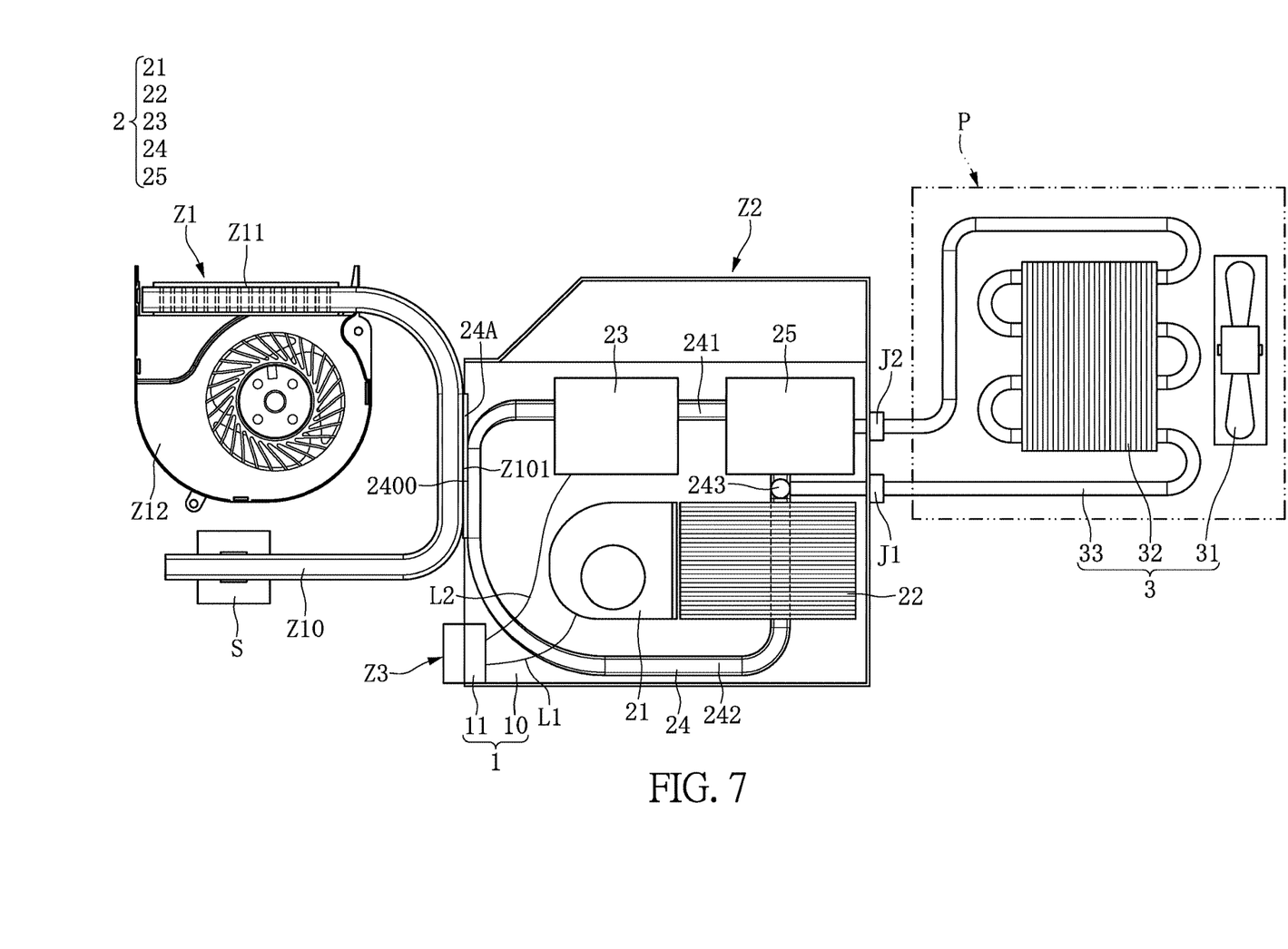
FIG. 7 shows a top, schematic view of the fixed main heat-dissipating module and the detachable auxiliary heat-dissipating module of the detachable auxiliary heat-dissipating module without a top cover according to the second embodiment of the instant disclosure.

Referring to FIG. 7, the second embodiment of the instant disclosure provides a detachable auxiliary heat-dissipating module Z2 for contacting a fixed main heat-dissipating module Z1. Comparing FIG. 7 with FIG. 2, the different between the second embodiment and the first embodiment is as follows: in the second embodiment, the detachable auxiliary heat-dissipating module Z2 further comprises an external heat-dissipating structure 3 disposed outside the detachable casing 10. For example, the external heat-dissipating structure 3 may be disposed on a heat-dissipating plate P for supporting the portable electronic device Z. More particularly, the external heat-dissipating structure 3 includes an external heat-dissipating fan 31, a plurality of external heat-dissipating fins 32 adjacent to the external heat-dissipating fan 31, and an external pipe 33 communicated with the circulation pipe 24 and passing through the external heat-dissipating fins 32. Please note, one of two opposite ends of the external pipe 33 and the circulation pipe 24 are mated with each other by a first quick disconnector J1, the other end of the external pipe 33 and the circulation pipe 24 are mated with each other by a second quick disconnector J2, and an extra change-over switch 243 is disposed on the circulation pipe 24, such that the detachable auxiliary heat-dissipating module Z2 can use the inside mounted heat-dissipating structure 2 or both the inside mounted heat-dissipating structure 2 and the external heat-dissipating structure 3 to execute water-cooling heat dissipation.

Third Embodiment

Figure 8:
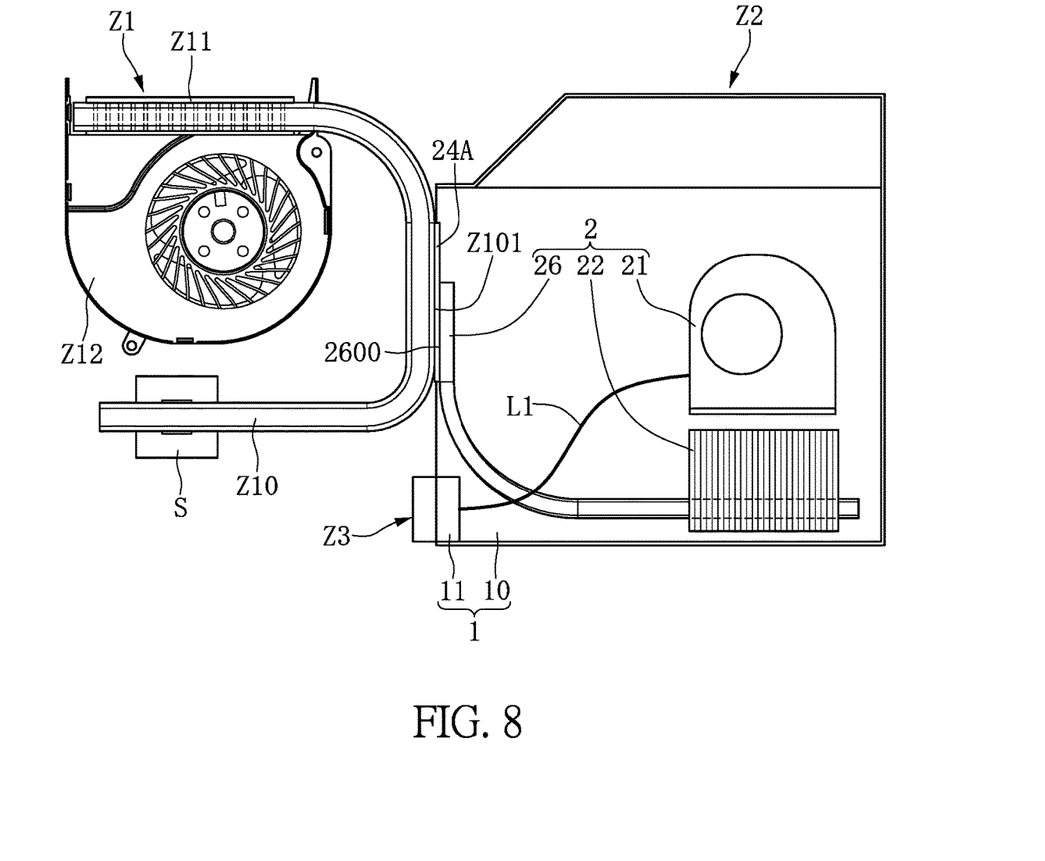
FIG. 8 shows a top, schematic view of the fixed main heat-dissipating module and the detachable auxiliary heat-dissipating module of the detachable auxiliary heat-dissipating module without a top cover according to the third embodiment of the instant disclosure.

Referring to FIG. 8, the third embodiment of the instant disclosure provides a detachable auxiliary heat-dissipating module Z2 comprising an outer casing structure 1 and an inside mounted heat-dissipating structure 2. Comparing FIG. 8 with FIG. 2, the different between the third embodiment and the first embodiment is as follows: in the third embodiment, the inside mounted heat-dissipating structure 2 includes an inside mounted heat-dissipating fan 21 electrically connected to the electrical connector 11 through a conductive wire L1, a plurality of inside mounted heat-dissipating fins 22 adjacent to the inside mounted heat-dissipating fan 21, and an auxiliary heat pipe 26 passing through the inside mounted heat-dissipating fins 22.

More particularly, the auxiliary heat pipe 26 has a contact portion exposed from the detachable casing 10 to directly contact the fixed main heat-dissipating module Z1, such that heat generated by the fixed main heat-dissipating module Z1 is partially transmitted to the auxiliary heat pipe 26 through the contact portion. For example, the contact portion may be a heat-conducting pad (24A or 24B) disposed on a lateral contact surface 2600 of the auxiliary heat pipe 26, and the heat-conducting pad (24A or 24B) of the auxiliary heat pipe 26 is exposed from the detachable casing 10 to directly contact the main heat pipe Z10 of the fixed main heat-dissipating module Z1 (as shown in FIG. 3 or FIG. 4), such that the heat generated by the main heat pipe Z10 of the fixed main heat-dissipating module Z1 is partially transmitted to the auxiliary heat pipe 26 through the heat-conducting pad (24A or 24B).

Please note, the contact portion may be a lateral contact surface 2600 of the auxiliary heat pipe 26, and the lateral contact surface 2600 of the auxiliary heat pipe 26 is exposed from the detachable casing 10 to directly contact a lateral contact surface Z101 of a main heat pipe Z10 of the fixed main heat-dissipating module Z1, such that the heat generated by the main heat pipe Z10 of the fixed main heat-dissipating module Z1 is partially transmitted to the auxiliary heat pipe 26 through the lateral contact surface 2600 of the auxiliary heat pipe 26.

In conclusion, the heat-dissipating efficiency of the portable electronic device Z or the detachable auxiliary heat-dissipating module Z2 thereof is increased due to the design of "the heat generated by the fixed main heat-dissipating module Z1 is partially transmitted to the circulation pipe 24 through the contact portion that is exposed from the detachable casing 10 to directly contact the fixed main heat-dissipating module Z1" or "the heat generated by the fixed main heat-dissipating module Z1 is partially transmitted to the auxiliary heat pipe 26 through the contact portion that is exposed from the detachable casing 10 to directly contact the fixed main heat-dissipating module Z1".

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A portable electronic device comprising:
    a predetermined receiving groove formed therein;
    a power connector;
    a fixed main heat-dissipating module fixed therein and having a main heat pipe; and
    a detachable auxiliary heat-dissipating module contacting the fixed main heat-dissipating module and having:
        an outer casing structure including a detachable casing detachably disposed inside the predetermined receiving groove and an electrical connector disposed on the detachable casing and electrically connected to the power connector; and
        an inside mounted heat-dissipating structure disposed inside the detachable casing, wherein the inside mounted heat-dissipating structure includes an inside mounted heat-dissipating fan electrically connected to the electrical connector, a plurality of inside mounted heat-dissipating fins adjacent to the inside mounted heat-dissipating fan, and an auxiliary heat pipe passing through the inside mounted heat-dissipating fins;
    wherein the auxiliary heat pipe has a heat-conducting pad disposed on a lateral contact surface of the auxiliary heat pipe and exposed from the detachable casing to directly contact a lateral contact surface of the main heat pipe of the fixed main heat-dissipating module by way of detachable connection, such that heat generated by the main heat pipe of the fixed main heat-dissipating module is partially transmitted to the auxiliary heat pipe through the heat-conducting pad, wherein the lateral contact surfaces of the auxiliary heat pipe and the main heat pipe are plane surfaces, and a contacting area between the lateral contact surface of the auxiliary heat pipe and the heat-conducting pad is larger than that between the lateral contact surface of the main heat pipe and the heat-conducting pad.

2. The portable electronic device of claim 1, wherein the predetermined receiving groove is a containing groove for receiving a detachable optical disk drive or a detachable battery.

3. A portable electronic device comprising:
    a predetermined receiving groove formed therein;
    a power connector;
    a fixed main heat-dissipating module fixed therein and having a main heat pipe; and a detachable auxiliary heat-dissipating module contacting the fixed main heat-dissipating module and having:
        an outer casing structure including a detachable casing detachably disposed inside the predetermined receiving groove and an electrical connector disposed on the detachable casing and electrically connected to the power connector; and
        an inside mounted heat-dissipating structure disposed inside the detachable casing, wherein the inside mounted heat-dissipating structure includes an inside mounted heat-dissipating fan electrically connected to the electrical connector, a plurality of inside mounted heat-dissipating fins adjacent to the inside mounted heat-dissipating fan, and an auxiliary heat pipe passing through the inside mounted heat-dissipating fins,
    wherein the auxiliary heat pipe has a heat-conducting pad disposed on a lateral contact surface of the auxiliary heat pipe and exposed from the detachable casing to directly contact a lateral contact surface of the main heat pipe and one selected from a top contact surface and a bottom contact surface of the main heat pipe of the fixed main heat-dissipating module by way of detachable connection, such that heat generated by the main heat pipe of the fixed main heat-dissipating module is partially transmitted to the auxiliary heat pipe through the heat-conducting pad, wherein the lateral contact surface of the auxiliary heat pipe and the lateral contact surface, the top contact surface and the bottom contact surface of the main heat pipe are plane surfaces, and a contacting area between the lateral contact surface of the auxiliary heat pipe and the heat-conducting pad is larger than that between the lateral contact surface of the main heat pipe and the heat-conducting pad and that between the heat-conducting pad and the one selected of the top contact surface and the bottom contact surface of the main heat pipe.

4. The portable electronic device of claim 3, wherein the predetermined receiving groove is a containing groove for receiving a detachable optical disk drive or a detachable battery.

* * * * *